United States Patent
Huang

(10) Patent No.: US 7,435,354 B2
(45) Date of Patent: Oct. 14, 2008

(54) TREATMENT METHOD FOR SURFACE OF PHOTORESIST LAYER AND METHOD FOR FORMING PATTERNED PHOTORESIST LAYER

(75) Inventor: Kao-Su Huang, Yongkang (TW)

(73) Assignee: United Microelectronic Corp., Hsinchu (TW)

( * ) Notice: Subject to any disclaimer, the term of this patent is extended or adjusted under 35 U.S.C. 154(b) by 0 days.

(21) Appl. No.: 11/031,824

(22) Filed: Jan. 6, 2005

(65) Prior Publication Data

US 2006/0144815 A1   Jul. 6, 2006

(51) Int. Cl.
    *B44C 1/22* (2006.01)
(52) U.S. Cl. .............................. 216/58; 216/67; 216/79; 438/636; 438/637; 438/714; 438/717; 438/719; 438/723; 438/724; 438/725; 438/736
(58) Field of Classification Search .................... 216/58, 216/67; 438/636, 637, 638
    See application file for complete search history.

(56) References Cited

U.S. PATENT DOCUMENTS

| 6,541,164 | B1 * | 4/2003 | Kumar et al. .................. 430/5 |
| 6,716,571 | B2 * | 4/2004 | Gabriel et al. ............. 430/313 |
| 7,157,377 | B2 * | 1/2007 | Garza et al. ................. 438/694 |
| 2002/0094693 | A1 * | 7/2002 | Yang et al. ................... 438/712 |
| 2004/0157430 | A1 * | 8/2004 | Mandal ...................... 438/636 |

\* cited by examiner

*Primary Examiner*—Lan Vinh
*Assistant Examiner*—Maki Angadi
(74) *Attorney, Agent, or Firm*—J.C. Patents

(57) ABSTRACT

A treatment method for a surface of a photoresist layer is provided. After forming a patterned photoresist layer over a wafer, a surface treatment step is performed to the photoresist layer by using at least one reaction gas comprising hydrogen bromide or hydrogen iodide to form a hardened layer over the surface of the photoresist layer. Wherein, the surface treatment step and the etching step are in-situ performed.

26 Claims, 3 Drawing Sheets center periphery center periphery

US 7,435,354 B2

TREATMENT METHOD FOR SURFACE OF PHOTORESIST LAYER AND METHOD FOR FORMING PATTERNED PHOTORESIST LAYER

BACKGROUND OF THE INVENTION

1. Field of the Invention

The present invention relates to a semiconductor process, and more particularly, to a treatment method for a surface of a photoresist layer and a method for forming a patterned photoresist layer by using the treatment method.

2. Description of the Related Art

Toward a higher and higher degree of integration in the field of semiconductor technology, designs for circuit devices have to meet the trend in reducing sizes of devices. Currently, 90-nm semiconductor technology has been developed and applied in processes. One of the most essential processes in semiconductor technology is photolithographic process, which plays an important role in deciding critical dimensions of devices.

During photolithographic process, a patterned photoresist layer is formed by performing a exposure step and a development step for a photoresist layer. Due to the requirement of small dimensions, dimensions of the patterned photoresist become smaller, and consequently the profiles of the patterned photoresist layer cannot be easily maintained. Sometimes, collapses of the patterned photoresist layer may occur. Also, because of the requirement of small dimensions and components of the photoresist, when an etching process is performed, a patterned photoresist layer suffers high temperature from plasma to cause the patterned photoresist layer collapse.

FIG. 1 is a picture of a patterned photoresist layer created by a prior art photolithographic process of the 90-nm technology. Referring to FIG. 1, due to the reduction of the line width of the patterned photoresist layer, the profile of the patterned photoresist layer is distorted. In the subsequent etching process using the patterned photoresist layer as a mask will result in pattern distortions or undesired profiles on the film layer due to the distorted patterned photoresist layer.

SUMMARY OF THE INVENTION

The present invention is directed to a treatment method for a surface of a photoresist layer to effectively maintain a profile of a photoresist pattern and avoid profile distortion during pattern transfer.

The present invention is also directed to a method for forming a patterned photoresist layer with a clearer and precise pattern profile.

The present invention provides a treatment method for a surface of a photoresist layer. The treatment method is that after forming a patterned photoresist layer over a wafer, a surface treatment step is performed to the photoresist layer by using at least one reaction gas comprising hydrogen bromide or hydrogen iodide to form a hardened layer over the surface of the photoresist layer. Wherein, the surface treatment step and an etching process are in-situ performed.

The present invention also provides a method for forming a patterned photoresist layer. The method first forms a bottom anti-reflection coating layer over a material layer. A patterned photoresist layer is formed over the bottom anti-reflection coating layer. A surface treatment step is performed to the patterned photoresist layer by using at least one reaction gas comprising hydrogen bromide or hydrogen iodide to form a hardened layer over the surface of the patterned photoresist layer. Wherein, the surface treatment step and an etching process are in-situ performed.

The present invention further provides another method for forming a patterned photoresist layer. The method first forms a bottom anti-reflection coating layer over a material layer. A patterned photoresist layer is formed over the bottom anti-reflection coating layer. Then an etching process is performed to the bottom anti-reflection coating layer by using the patterned photoresist layer as a mask. A surface treatment step is performed to the patterned photoresist layer by using at least one reaction gas comprising hydrogen bromide or hydrogen iodide to form a hardened layer over at least the surface of the patterned photoresist layer. Wherein, the surface treatment step and an etching process are in-situ performed.

According to an embodiment of the present invention, the method for forming the patterned photoresist layer, as described, further comprises forming a mask layer over the material layer before the step of forming the bottom anti-reflection coating layer. Wherein, the material of the mask layer has an etch selectivity different from that of the material layer. For example, the mask layer can be a dielectric material, such as silicon oxide or silicon nitride.

According to an embodiment of the present invention, in the method for forming the patterned photoresist layer described above, the material of the material layer comprises polysilicon or silicon nitride.

According to an embodiment of the present invention, in the method for forming the patterned photoresist layer, or the treatment method for the surface of the photoresist layer described above, the flow rate of the reaction gas can be, for example, 30-500 sccm. The plasma generated from the reaction gas can be created by, for example, a voltage less than 500V. The temperature of the surface treatment step can be, for example, 20-80° C. The pressure of the surface treatment step can be, for example, 5-80 mTorr.

According to an embodiment of the present invention, in the method for forming the patterned photoresist layer, or the treatment method for the surface of the photoresist layer described above, the material of the photoresist layer comprises a Deep UV photoresist material, such as, a photoresist material of 157-nm or shorter, a 193-nm photoresist material, or a 248-nm photoresist material.

Before the etching process, the present invention performs a surface treatment step to the patterned photoresist layer, which serves as an etching mask, to form a hardened layer over the surface of the photoresist layer. Accordingly, the pattern of the patterned photoresist layer can be effectively maintained. Distortions or even collapses of the patterned photoresist layer can be thus avoided. The method of the present invention will reduce profile distortion of a thin film layer, which is to be used as a mask in the subsequent etching process.

The above and other features of the present invention will be better understood from the following detailed description of the preferred embodiments of the invention that is provided in communication with the accompanying drawings.

DESCRIPTION OF SOME EMBODIMENTS

There has been a problem in this field that a patterned photoresist layer formed by a photolithographic process will be distorted or collapsed easily when the line widths become narrower. The present invention, therefore, provides a treatment method for the surface of the photoresist layer to solve the issue described above. After forming a patterned photoresist layer over a wafer by using photolithographic equipment, the wafer will be moved to an etching chamber, and then the treatment for the surface of the photoresist layer of the present invention and a etching process are performed in the etching chamber. In the etching chamber, the surface treatment step is performed to the surface of the photoresist layer by using at least one reaction gas comprising hydrogen bromide or hydrogen iodide to form a hardened layer over the surface of the photoresist layer.

Wherein, the surface treatment step uses a radio frequency voltage to excite the reaction gas into plasma serving to form the hardened layer over the surface of the photoresist layer. The hardened layer effectively maintains the pattern of the patterned photoresist layer. In addition, the material of the photoresist layer can be, for example, a Deep UV photoresist material, such as a photoresist material of 157-nm or shorter, a 193-nm photoresist material, or a 248-nm photoresist material. Wherein the photoresist material of 157-nm or shorter is suitable for a process under the 45-nm technology. In addition, the flow rate of the reaction gas can be, for example, 30-500 sccm. It is preferred about 100 sccm. The voltage used to generate the plasma from the reaction gas can be, for example, less than 500V. The temperature of the surface treatment step can be, for example, 20-80° C. It is preferred about 30° C. The pressure of the surface treatment step can be, for example, 5-80 mTorr. It is preferred about 5 mTorr.

Moreover, the surface treatment step is performed in an etch chamber. Accordingly, the surface treatment step and the etching process are in-situ performed. It means that, after performing the surface treatment step of the present invention, the etching process is continually performed by using the patterned photoresist layer having the hardened patterned photoresist layer as a mask in the same etching chamber.

Figure 1:
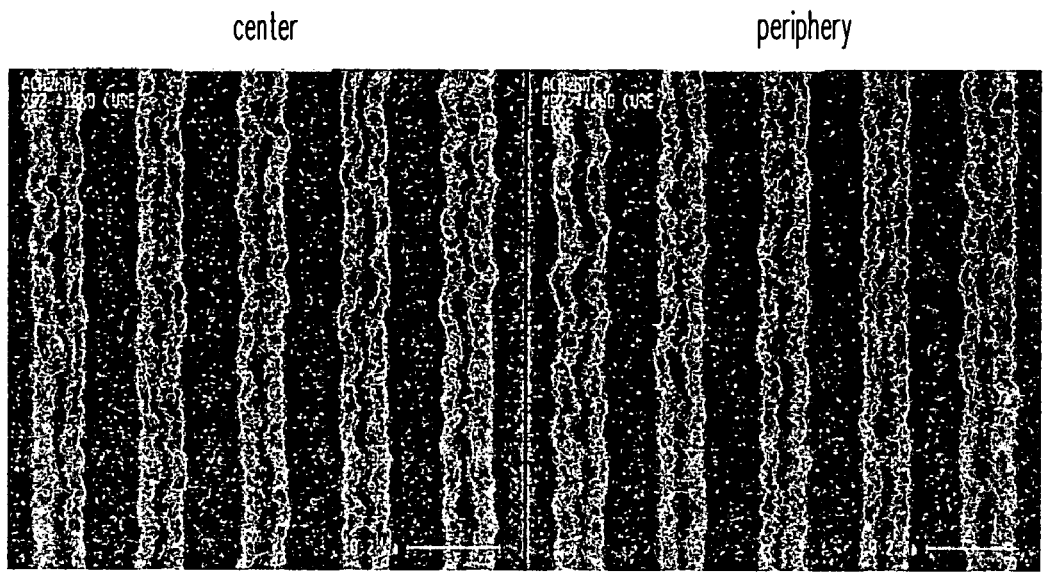
FIG. 1 is a picture of a patterned photoresist layer created by a prior art photolithographic process of the 90-nm technology.
Figure 2:
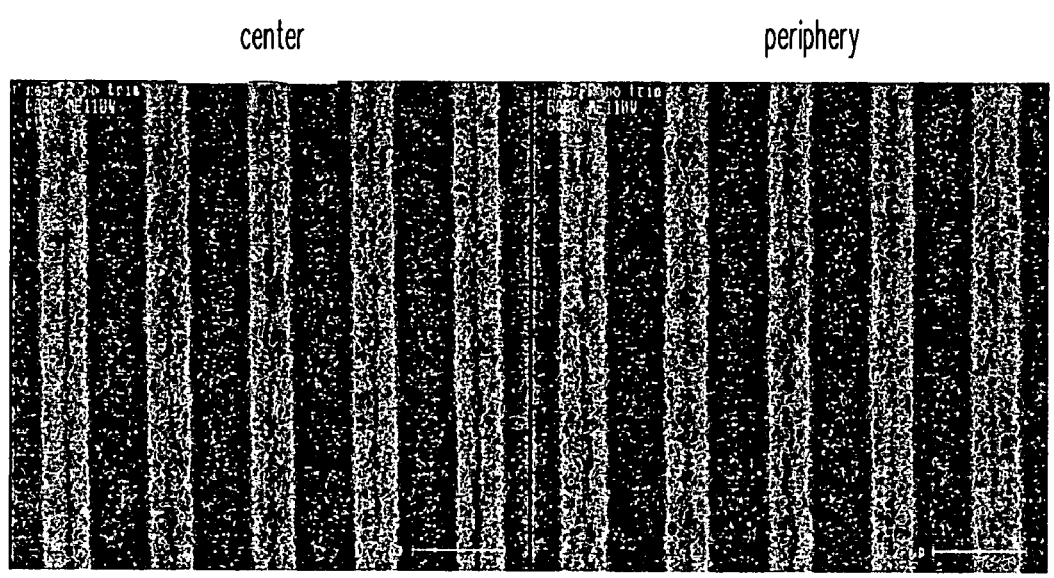
FIG. 2 is a picture of a patterned photoresist layer created by a method of 90-nm technology of the present invention.

In 90-nm technology, the picture of a patterned photoresist layer generated by the present invention is shown in FIG. 2. Referring to FIGS. 1 and 2, the patterned photoresist layer without the surface treatment of the present invention is distorted, as shown in FIG. 1; and a well-defined patterned photoresist layer after the surface treatment of the present invention is acquired, as shown in FIG. 2.

According to the treatment method for the photoresist layer of the embodiment of the present invention, the well-defined patterned photoresist layer can be acquired by forming the hardened layer over the surface of the photoresist layer. Accordingly, distortions of the patterned photoresist layer can be avoided, even collapses can be prevented.

The application of the present invention in semiconductor technology is described in more detail in the following example which, however, never limits the scope of the invention in any way.

Figure 3A:
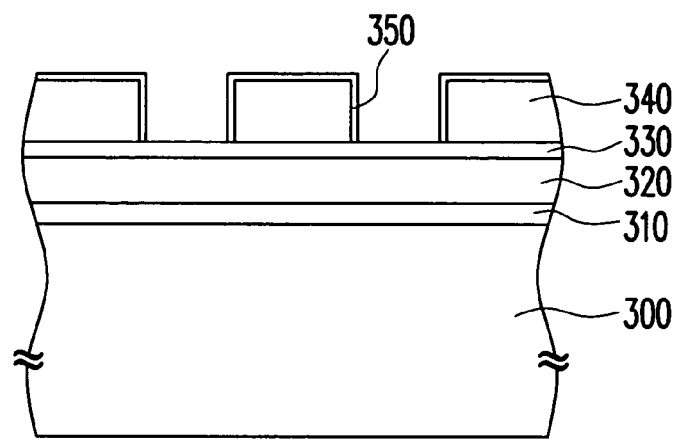
FIGS. 3A-3C are schematic cross sectional views showing progression of a method for forming a trench according to an embodiment of the present invention.
Figure 3B:
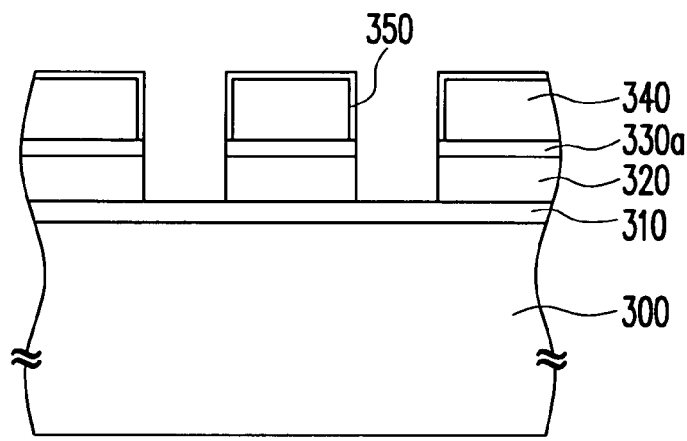
Figure 3C:
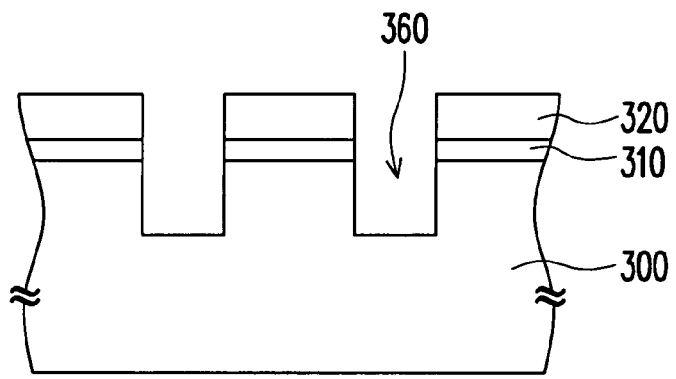

FIGS. 3A-3C are schematic cross sectional views showing progression of a method for forming a trench according to an embodiment of the present invention. Referring to FIG. 3A, a semiconductor substrate 300 is provided. A pad oxide layer 310 is formed over the semiconductor substrate 300. The material of the pad oxide layer 310 can be, for example, silicon oxide which is formed by a thermal oxidation, for example. A material layer 320 is formed over the pad oxide layer 310. The material of the material layer 320 can be, for example, silicon nitride which can be formed by a chemical vapor deposition (CVD) method, for example.

Referring to FIG. 3A, a bottom anti-reflection coating layer 330 is formed over the material layer 320. The method of forming the bottom anti-reflection coating layer 330 can be a CVD method, for example. In a preferred embodiment, a mask layer (not shown) is formed over the material layer 320 before the step of forming the bottom anti-reflection coating layer 330.

Then, a patterned photoresist layer 340 is formed over the bottom anti- reflection coating layer 330. The method of forming the patterned photoresist layer 340 can be a photolithographic process, for example. Wherein, the material of the patterned photoresist layer 340 can be, for example, a Deep UV photoresist material, such as a photoresist material of 157-nm or shorter, a 193-nm photoresist material, or a 248-nm photoresist material. Wherein the photoresist material of 157-nm or shorter is suitable for a process under the 45-nm technology.

A surface treatment step is performed to the patterned photoresist layer 340 by using at least one reaction gas comprising hydrogen bromide or hydrogen iodide. The surface treatment step excites the reaction gas into plasma by using a radio frequency voltage, for example. The plasma reacts with the patterned photoresist layer 340 to form a hardened layer 350 over the surface of the patterned photoresist layer 340 so that the strength of the patterned photoresist layer 340 can be enhanced. Wherein, the flow rate of the reaction gas can be, for example, 30-500 sccm. It is preferred about 100 sccm. The voltage used to generate the plasma from the reaction gas can be, for example, less than 500V. The temperature of the surface treatment step can be, for example, 20-80° C. It is preferred about 30° C. The pressure of the surface treatment step can be, for example, 5-80 mTorr. It is preferred about 5 mTorr. Wherein, the surface treatment step and the etching process are in-situ performed.

In a preferred embodiment, after the surface treatment step described above, a trim step is performed to the patterned photoresist layer to reduce the dimension of the photoresist pattern. In another preferred embodiment, the trim step to reduce the dimension of the photoresist pattern can be performed before the surface treatment step of the patterned photoresist layer 340.

Referring to FIG. 3B, by using the patterned photoresist layer 340 as a mask, a portion of the bottom anti-reflection coating layer 330 is removed to form a patterned bottom anti-reflection coating layer 330a. The removal method can be an etching process, for example. By using the patterned photoresist layer 340 and the patterned bottom anti-reflection coating layer 330a as a mask, a portion of the material layer 320 is removed. The removal method can be an etching process, for example, to the material layer 320.

Referring to FIG. 3C, the patterned photoresist layer 340 is removed by an etching process, for example. The patterned bottom anti-reflection coating layer 330a is removed by an etch process, for example. By using the material layer 320 as a mask, a portion of the semiconductor substrate 300 is then removed to form trenches 360 within the semiconductor substrate 300. The removal method can be an etching process, for example.

After forming trenches 360, a dielectric material can be filled in the trenches 360 to form isolation structures, or other adequate processes can be performed to the trenches 360. One of ordinary skill in the art may perform different processes to the trenches 360 based on different requirements. Since these processes are well known in this filed, detailed descriptions are not repeated here.

Furthermore, in another preferred embodiment, after the patterned photoresist layer 340 is formed, by using the patterned photoresist layer 340 as a mask, at first an etching process to a bottom anti-reflection coating layer is performed. Then, the surface treatment step is performed to the patterned photoresist layer to form a hardened layer over the patterned photoresist layer, or even over the bottom anti- reflection coating layer, to effectively maintain the pattern profile of the patterned photoresist layer.

Figure 4A:
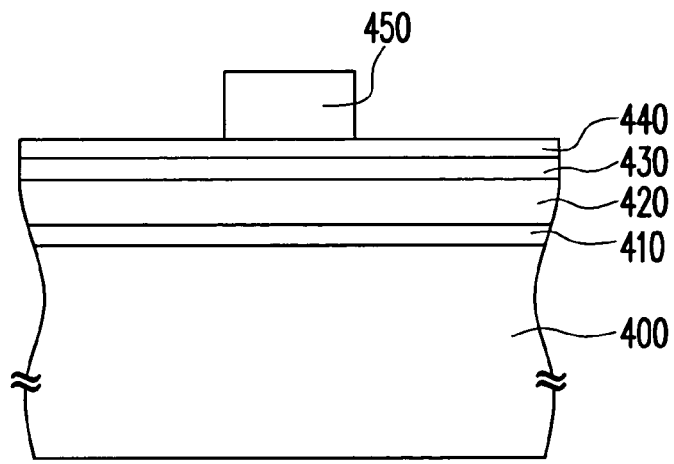
FIGS. 4A-4C are schematic cross sectional drawings showing progression of forming a gate structure according to an embodiment of the present invention.
Figure 4B:
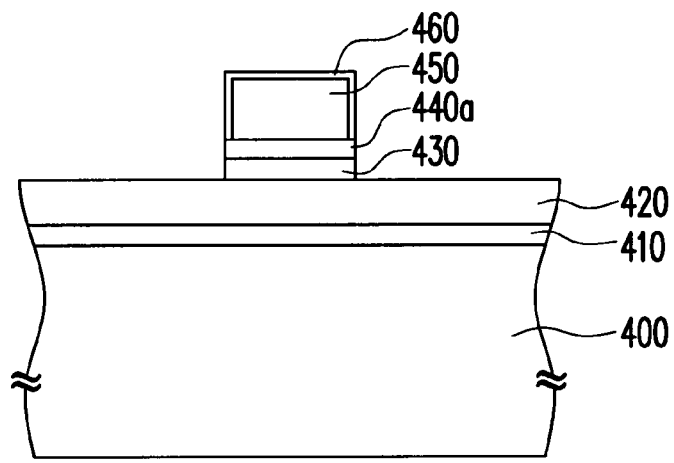
Figure 4C:
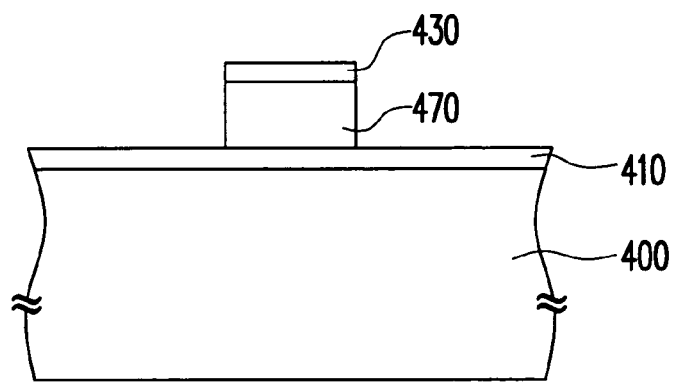

FIGS. 4A-4C are schematic cross sectional drawings showing progression of forming a gate structure according to an embodiment of the present invention. Referring to FIG. 4A, a semiconductor substrate 400 is provided. A gate oxide layer 410 is formed over the semiconductor substrate 400. The material of the gate oxide layer 410 can be, for example, silicon oxide which is formed by a thermal oxidation, for example. A material layer 420 is formed over the gate oxide layer 410. The material of the material layer 420 can be, for example, polysilicon or other material for the gate structure which can be formed by a chemical vapor deposition (CVD) method, for example.

Referring to FIG. 4A, a mask layer 430 is formed over the material layer 420. The material of the mask layer 430 has an etch selectivity different from that of the material layer 420. The mask layer 430 can be a dielectric material, such as silicon nitride or silicon oxide. In another embodiment, the step of forming the mask layer 430 over the material layer 420 can be saved. A bottom anti-reflection coating layer 440 is then formed over the mask layer 430. The method of forming the bottom anti-reflection coating layer 440 can be a CVD method, for example.

Then, a patterned photoresist layer 450 is formed over the bottom anti-reflection coating layer 440. The method of forming the patterned photoresist layer 450 can be a photolithographic process, for example. Wherein, the material of the patterned photoresist layer 450 can be, for example, a Deep UV photoresist material, such as a photoresist material of 157-nm or shorter, a 193-nm photoresist material, or a 248-nm photoresist material. Wherein the photoresist material of 157-nm or shorter is suitable for a process under the 45-nm technology.

Referring to FIG. 4B, by using the patterned photoresist layer 450 as a mask, a portion of the bottom anti-reflection coating layer 440 is removed to form a patterned bottom anti-reflection coating layer 440a. The removal method can be an etching process, for example.

A surface treatment step is performed to the patterned photoresist layer 450 by using at least one reaction gas comprising hydrogen bromide or hydrogen iodide. The surface treatment step excites the reaction gas into plasma by using a radio frequency voltage, for example. The plasma reacts with the patterned photoresist layer 450 to form a hardened layer 460 over at least the surface of the patterned photoresist layer 450 so that the strength of the patterned photoresist layer 450 can be enhanced. Wherein, the flow rate of the reaction gas can be, for example, 30-500 sccm. It is preferred about 100 sccm. The voltage used to generate the plasma from the reaction gas can be, for example, less than 500V. The temperature of the surface treatment step can be, for example, 20-80° C. It is preferred about 30° C. The pressure of the surface treatment step can be, for example, 5-80 mTorr. It is preferred about 5 mTorr. Wherein, the surface treatment step and the etching process are in-situ performed.

In a preferred embodiment, after the surface treatment step described above, a trim step is performed to the patterned photoresist layer to reduce the dimension of the photoresist pattern. The trim step to reduce the dimension of the photoresist pattern can be performed before or after the surface treatment step of the patterned photoresist layer 450.

Referring to FIG. 4B, by using the patterned photoresist layer 450 and the patterned bottom anti-reflection coating layer 440a as a mask, a portion of the material layer 430 is removed. The removal method can be an etching process, for example.

Referring to FIG. 4C, the patterned photoresist layer 450 is removed by an etching process, for example. The patterned bottom anti-reflection coating layer 440a is removed by an etching process, for example. Then a pattern process is performed to the material layer 420. By using the mask layer 430 as a mask, the etching process is performed to the material layer 420 to form a gate 470.

After forming the gate 470, source and drain regions are formed within the substrate 400 to constitute a metal-oxide-semiconductor (MOS) transistor, or to perform other processes to form different devices. With this aspect, one of ordinary skill in the art may perform different processes to the structure based on different requirements. Since these processes are well known in this filed, detailed descriptions are not repeated here.

In another preferred embodiment, before etching the bottom anti-reflection coating layer, the surface treatment step is performed to the patterned photoresist layer to form a hardened layer over the patterned photoresist layer to effectively maintain the pattern of the patterned photoresist layer.

Accordingly, the method of the present invention includes the following advantages:

1. According to the method for forming the patterned photoresist layer, the profile of the photoresist layer can be effectively maintained without distorting or collapsing the patterned photoresist layer. The pattern can be precisely transferred to other layers.

2. According to the method of the present invention, a trim step is performed to the patterned photoresist layer to reduce the dimension of the photoresist pattern. Accordingly, the dimension of the photoresist pattern will be reduced and a smaller line width can be obtained.

Although the present invention has been described with reference to particular embodiments, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method for forming a patterned photoresist layer, comprising:
   forming a bottom anti-reflection coating layer over a material layer;
   forming a patterned photoresist layer over the bottom anti-reflection coating layer; and
   performing a surface treatment step for the patterned photoresist layer by using at least one reaction gas comprising hydrogen bromide or hydrogen iodide to form a hardened layer over the surface of the patterned photoresist layer, wherein the hardened layer is used to maintain the profile of the photoresist layer; and performing an etching process to the bottom anti-reflection coating layer by using the patterned photoresist layer as a mask after the surface treatment step, wherein the surface treatment step and an etching process are in-situ performed.

2. The method for forming a patterned photoresist layer of claim 1, wherein a flow rate of the reaction gas is 30-500 sccm.

3. The method for forming a patterned photoresist layer of claim 1, wherein plasma generated from the reaction gas is created by a voltage less than 500V.

4. The method for forming a patterned photoresist layer of claim 1, wherein a temperature of the surface treatment step is 20-80° C.

5. The method for forming a patterned photoresist layer of claim 1, wherein a pressure of the surface treatment step is 5-80mTorr.

6. The method for forming a patterned photoresist layer of claim 1, wherein a material of the material layer comprises polysilicon or silicon nitride.

7. The method for forming a patterned photoresist layer of claim 1, wherein a material of the photoresist layer comprises a Deep UV photoresist material.

8. The method for forming a patterned photoresist layer of claim 7, wherein the Deep UV photoresist material comprises a photoresist material of 157-nm or shorter, a 193-nm photoresist material, or a 248-nm photoresist material.

9. The method for forming a patterned photoresist layer of claim 1, further comprising forming a mask layer over the material layer before the step of forming the bottom anti-reflection coating layer.

10. The method for forming a patterned photoresist layer of claim 9, wherein a material of the mask layer has an etch selectivity different from that of the material layer.

11. The method for forming a patterned photoresist layer of claim 10, wherein the material of the mask layer comprises a dielectric material.

12. The method for forming a patterned photoresist layer of claim 11, wherein the dielectric material comprises silicon nitride or silicon oxide.

13. A method for forming a patterned photoresist layer, comprising:
    forming a bottom anti-reflection coating layer over a material layer;
    forming a patterned photoresist layer over the bottom anti-reflection coating layer; and
    performing an etching process to the bottom anti-reflection coating layer by using the patterned photoresist layer as a mask; and
    performing a surface treatment step to the patterned photoresist layer by using at least one reaction gas comprising hydrogen bromide or hydrogen iodide to form a hardened layer over at least the surface of the patterned photoresist layer, wherein the surface treatment step and an etching process are in-situ performed, and the hardened layer is used to maintain the profile of the photoresist layer.

14. The method for forming a patterned photoresist layer of claim 13, wherein a flow rate of the reaction gas is 30-500sccm.

15. The method for forming a patterned photoresist layer of claim 13, wherein plasma generated from the reaction gas is created by a voltage less than 500V.

16. The method for forming a patterned photoresist layer of claim 13, wherein a temperature of the surface treatment step is 20-80° C.

17. The method for forming a patterned photoresist layer of claim 13, wherein a pressure of the surface treatment step is 5-80mTorr.

18. The method for forming a patterned photoresist layer of claim 13, wherein a material of the material layer comprises polysilicon or silicon nitride.

19. The method for forming a patterned photoresist layer of claim 13, wherein a material of the photoresist layer comprises a Deep UV photoresist material.

20. The method for forming a patterned photoresist layer of claim 19, wherein the Deep UV photoresist material comprises a photoresist material of 157-nm or shorter, a 193-nm photoresist material, or a 248-nm photoresist material.

21. The method for forming a patterned photoresist layer of claim 13 further comprising forming a mask layer over the material layer before the step of forming the bottom anti-reflection coating layer.

22. The method for forming a patterned photoresist layer of claim 21, wherein a material of the mask layer has an etch selectivity different from that of the material layer.

23. The method for forming a patterned photoresist layer of claim 22, wherein the material of the mask layer comprises a dielectric material.

24. The method for forming a patterned photoresist layer of claim 23, wherein the dielectric material comprises silicon nitride or silicon oxide.

25. The method for forming a patterned photoresist layer of claim 1, further comprising performing a trim step to the patterned photoresist layer to form a smaller photoresist pattern.

26. The method for forming a patterned photoresist layer of claim 13, further comprising performing a trim step to the patterned photoresist layer to form a smaller photoresist pattern.

* * * * *